United States Patent [19]
Mannle

[11] Patent Number: 5,390,194
[45] Date of Patent: Feb. 14, 1995

[54] ATG TEST STATION

[75] Inventor: Thomas M. Mannle, Franklin Square, N.Y.

[73] Assignee: Grumman Aerospace Corporation, Bethpage, N.Y.

[21] Appl. No.: 153,192

[22] Filed: Nov. 17, 1993

[51] Int. Cl.$^6$ ............................................. G06F 15/20
[52] U.S. Cl. ...................... 371/27; 324/73.1; 364/579; 364/580; 371/15.1; 371/22.1; 371/25.1
[58] Field of Search ............... 324/73.1; 364/579, 580; 371/15.1, 22.1, 25.1, 27

[56] References Cited

U.S. PATENT DOCUMENTS

| Re. 31,056 | 10/1982 | Chau et al. ............... 371/25.1 X |
| 3,599,161 | 10/1897 | Stoughton et al. ............... 395/575 |
| 3,764,995 | 10/1973 | Helf, Jr. et al. ............... 371/25.1 X |
| 3,854,125 | 12/1974 | Ehling et al. ............... 371/15.1 X |
| 4,176,780 | 12/1979 | Sacher et al. ............... 371/25.1 |
| 4,598,245 | 7/1986 | Groves et al. ............... 371/27 |
| 4,635,259 | 1/1987 | Schinabeck et al. ............... 371/22.6 |
| 4,637,020 | 1/1987 | Schinabeck ............... 371/25.1 |
| 4,642,561 | 2/1987 | Groves et al. ............... 371/27 X |
| 4,644,487 | 2/1987 | Smith ............... 371/23 X |
| 4,646,299 | 2/1987 | Schinabeck et al. ............... 371/25.1 |
| 4,652,814 | 3/1987 | Groves et al. ............... 371/27 |
| 4,709,366 | 11/1987 | Scott et al. ............... 371/26 X |
| 4,807,161 | 2/1989 | Comfort et al. ............... 364/571.01 X |
| 4,862,067 | 8/1989 | Brune et al. ............... 324/73.1 |
| 4,907,230 | 3/1990 | Heller et al. ............... 371/68.3 X |
| 4,963,824 | 10/1990 | Hsieh et al. ............... 324/72.5 X |
| 5,004,978 | 4/1991 | Morris, Jr. et al. ............... 324/73.1 X |
| 5,206,582 | 4/1993 | Ekstedt et al. ............... 324/73.1 |
| 5,212,443 | 5/1993 | West et al. ............... 324/73.1 X |

Primary Examiner—Edward R. Cosimano
Attorney, Agent, or Firm—Bacon & Thomas

[57] ABSTRACT

A low cost, office environment platform for performing off-station verification and integration of Automatic Test Program Generation test program sets for digital circuit boards includes a general purpose computer which oversees integration of the test program sets developed on the simulator with the digital circuit boards using a basic test control unit such as the HP16500 Logic Analysis System. A method of utilizing this apparatus involves generating and simulating the test program sets and applying the test program sets to the digital circuit boards during development with feedback to the host computer on which the test program sets are generated.

9 Claims, 3 Drawing Sheets

ATG TEST STATION

BACKGROUND OF THE INVENTION

1. Field of the Invention

This invention relates to a system and method for facilitating test program generation, and to a test station of the type in which a test control unit sends stimulus information to a unit under test (UUT), samples responses from the UUT, and analyzes the responses to determine whether the UUT is good or faulty.

2. Description of Related Art

A number of systems are currently available for testing complex electrical or electro-mechanical equipment through the use of a controller which sends stimulus information to a UUT, samples responses from the UUT, and analyzes the responses to determine whether the UUT is good or faulty.

The tests are carried out under the control of instructions known as test program sets (TPSs). A software simulation technique known as automatic test program generation (ATG) is used to generate TPSs for digital circuit boards. Suitable software for carrying out this technique includes commercially available LASAR TM Version 6 ATG software, which is run on a DEC VAX TM computer system.

Integration of the simulator's output with the UUT currently requires large and expensive government furnished automatic test equipment (ATE). The ATG test station (ATS) of the invention disclosed and claimed herein was developed to reduce ATE loading by providing a low cost, office environment platform to perform off-station verification and integration of a ATG test programs. Approximately 80-95% of the integration can be performed on the ATS. By significantly reducing the integration time, it is estimated that the ATS reduces the entire ATG test program development time by 30%, resulting in a significant competitive edge for the developer.

When taking the traditional approach to ATG test program development, the entire test program is developed before the start of integration. This results in the disadvantage that problems which arise early in the integration phase can have a significant impact on the rest of the test program, necessitating drastic unforeseen changes which can set the development program back by a significant amount. Currently, no system is available for developing a test program incrementally, enabling elimination of early problem areas and the testing during development of fundamental engineering calculations related to specific UUT circuitry.

SUMMARY OF THE INVENTION

It is accordingly a first objective of the invention to provide an ATG test station which enables simultaneous development and integration of TPSs, thus allowing the test program to be developed incrementally to eliminate early problem areas and perform tests as needed to prove fundamental engineering calculations related to specific UUTs circuitry.

It is a second objective of the invention to provide an ATG test station which facilitates test program generation and which can also be used as a stand-alone test station.

It is a third objective of the invention to provide a low cost, office environment platform to perform off-station verification and integration of ATG test programs.

It is a fourth objective of the invention to provide a method of developing test programs that uses an ATG test station to increase the efficiency of the test program development process.

These objectives are accomplished, in a preferred embodiment of the invention, by an ATG test station (ATS) which includes a general purpose computer such as an IBM PC-AT or compatible computer, a dedicated interface control system such as the Hewlett-Packard 16500 Logic Analysis System (LAS), and appropriate interface circuitry connected together via standard interface buses. A preferred method of utilizing the ATS involves the steps of integrating the UUT on the station prior to completion of the automatic test program and modifying the test program sets based on the results of the integration.

DETAILED DESCRIPTION OF THE PREFERRED EMBODIMENTS

Figure 1:
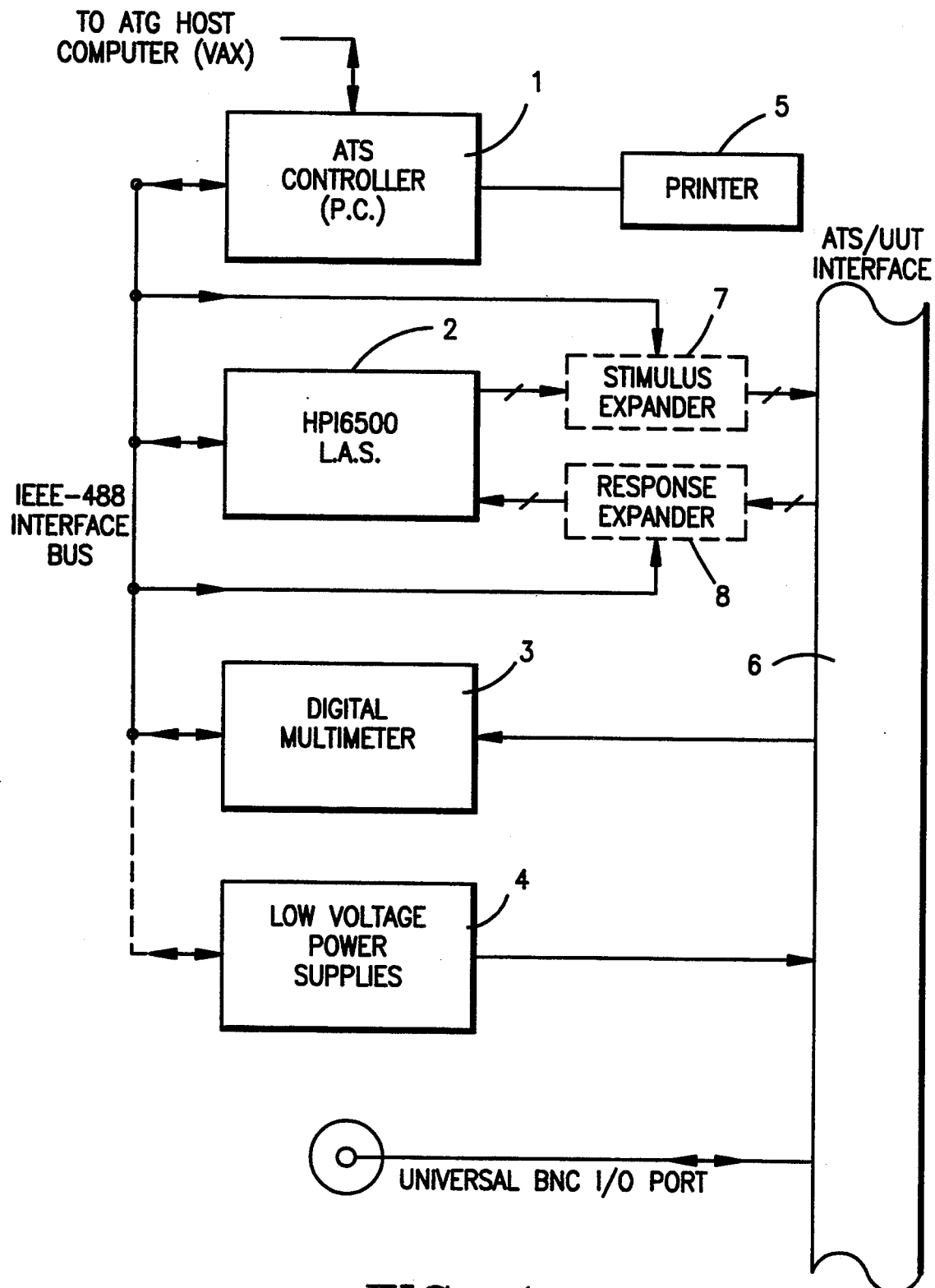
FIG. 1 is a functional block diagram of a preferred ATG test station capable of use as a stand alone test station in accordance with the principles of a preferred embodiment of the invention.

FIG. 1 is a functional block diagram of the preferred automated test system. The preferred test station includes a general purpose personal computer (PC) controller 1, for example an IBM PC AT TM or compatible computer equipped with a test executive program that controls the operation of the station and provides all necessary debugging routines for the automatic test program sets to be integrated on the station. While the test executive software can easily be programmed by those skilled in the art, it is noted that the program should be able to apply test patterns step-by-step, and to include provisions for pausing on a pattern applied to the digital circuitry of the UUT or other digital circuits being tested and printing responses. The use of a PC controller for integration enables integration and verification to be carried out on a low-cost, office environment platform.

The test patterns are applied to the UUT's digital circuitry by an interface controller and basic test control unit 2. The preferred basic test control unit is a Hewlett-Packard Model 16500 Logic Analysis System (LAS), which generates test patterns for transmittal via a suitable interface to the digital circuit boards of the UUT. The HP16500 LAS 2 communicates with PC controller 1 via an IEEE-488 standard interface bus.

In the illustrated embodiment, PC controller 1 oversees application of the digital test program by the basic control unit and also test procedures carried out by a digital multimeter 3. Power supplies 4 for the subject circuit boards may also be controlled by controller 1, and results printed out on a printer 5 on-site. Test program generation is carried out on a larger host computer such as a VAX TM using the above-mentioned LASAR version 6 ATG software simulator and downloaded to the PC for integration of the simulator's output with the tested digital circuitry.

Figure 2:
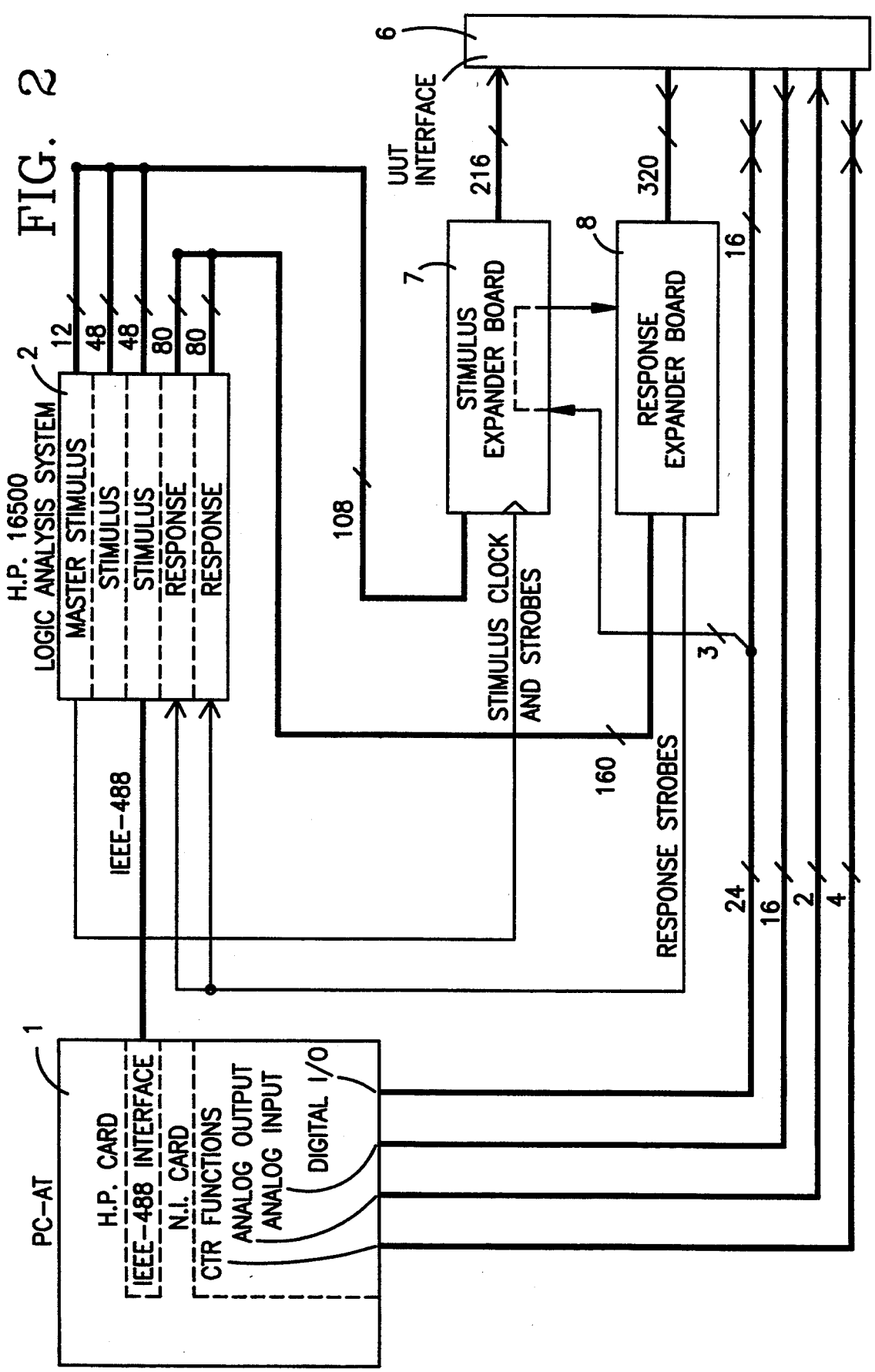
FIG. 2 is also a block diagram showing details of the controller and LAS illustrated in FIG. 1.

To expand the channel count which the test system is capable of handling, a stimulus channel expander board 7 and a response channel expander board 8 may optionally be provided between the HP15600 and the UUT interface 6. The circuitry on these boards is described in copending application Ser. Nos. 08/153,193 filed Nov. 17, 1993, and 08/153,194 also filed Nov. 17, 1993. As indicated in FIG. 2, the HP16500 provides 108 stimulus channels and 160 response channels. These may be increased to, respectively, 216 stimulus channels and 320 response channels through the use of the appropriate stimulus expander boards 7 and 8.

Control of the basic test unit by the PC controller 1 requires a standard interface card, while a National Instruments multi-function card is preferably included for the purpose of providing digital multimeter, counter-timer, and pulse generator functions as programmed by the test executive software in order to generate the various signals (N.I. CLEAR, N.I. STIMULUS TRANSPARENT, AND N.I. RESPONSE TRANSPARENT) which control the channel doubling aspects of the respective stimulus and response cards, as explained in the above-referenced copending applications. The National Instruments interface card can also be provided with an analog output and an analog input.

Figure 3:
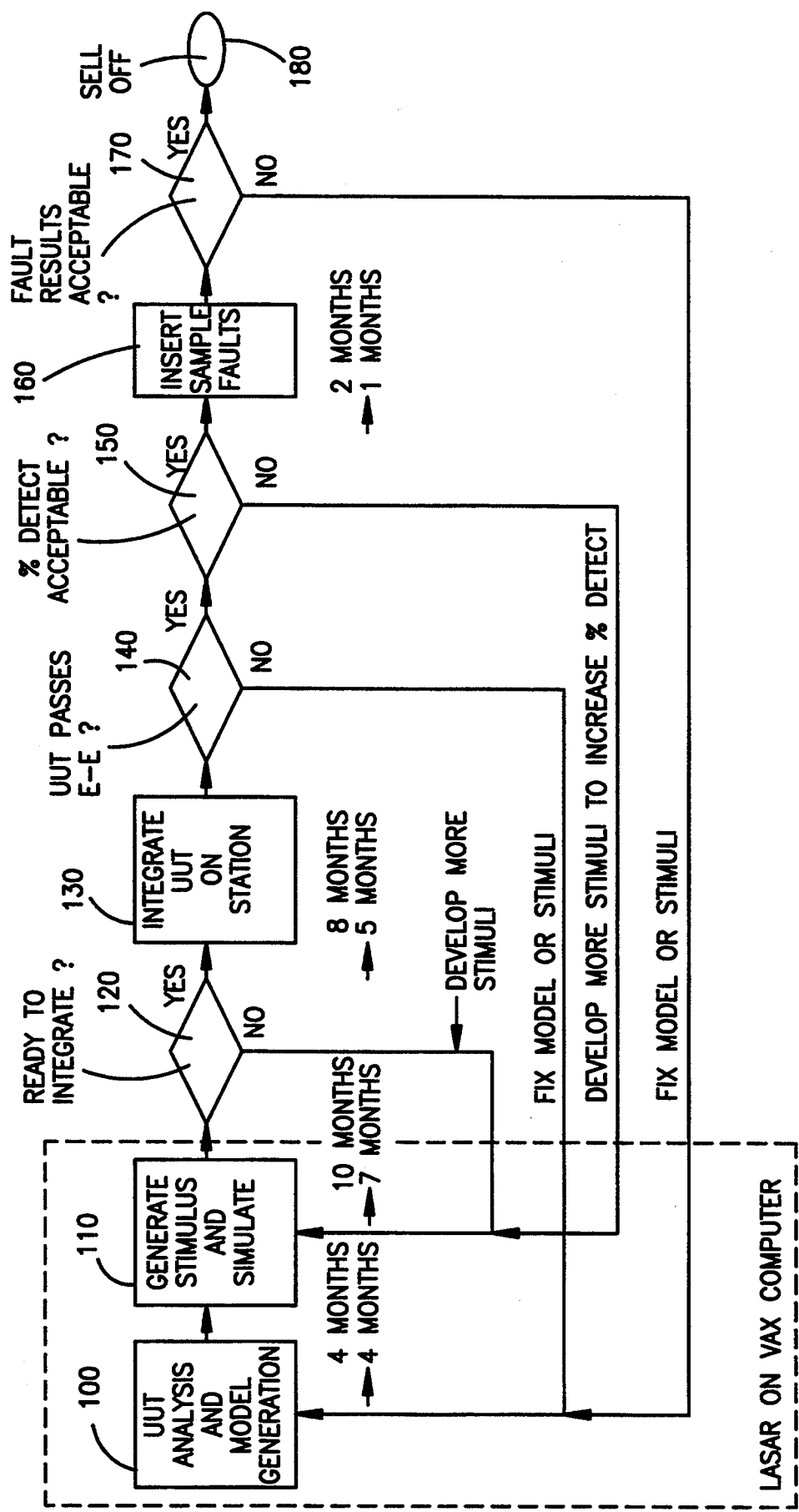
FIG. 3 is a flow chart illustrating a method utilizing the ATG test station shown in FIGS. 1 and 2.

As shown in FIG. 3, utilization of the test station to develop test programs begins with the step of analysis of the UUT's digital circuits and model generation based on that analysis (step 100), from which stimuli are generated and a UUT application is simulated by the ATG software (step 110). When the stimulus patterns are ready to be integrated into an operational test system (step 120), the patterns are integrated onto the digital circuit boards at the test station illustrated in FIGS. 1 and 2 using the PC controller test executive program for the ATS and the HP16500 basic test control unit (step 130). As shown in FIG. 3, if the stimulus patterns are not ready to be integrated into an operational test system (step 120) then the system loops back to step 110 in order to develop more stimuli.

The resulting integrated TPSs are then tested by applying the patterns to the digital circuit boards to be tested. First, the test patterns are checked for applicability to the UUT (step 140) and if the test patterns fail this test, either the model or the stimuli is corrected on the host computer. If the test patterns pass this test, the validity of the test results is then analyzed (step 150) and if the results are not acceptable, additional stimulus patterns are generated on the host computer. When the number of stimuli is sufficient and their operation verified, sample faults are inserted into the subject circuitry (step 160), and the results analyzed (step 170). If the results are not acceptable, as shown in FIG. 3, the model or stimuli needs to be corrected and the procedure loops back to step 100 and the procedure is repeated until the results are acceptable. The resulting test program set can then be used in the field (step 180).

By enabling the merger of UUT integration into the development process in this manner, it is estimated that the preferred test station will reduce the overall ATG test program development time by as much as 30%. Once integration has been accomplished, the preferred test station can itself be used as a test station for carrying out the necessary tests.

Having thus described a specific embodiment of the invention with reference to the accompanying drawings, it will be appreciated by those skilled in the art that the invention may be varied in a variety of ways without departing from the scope of the invention, and consequently it is intended that the invention not be limited by the above description or drawing figures, but rather that it be defined solely by the appended claims.

I claim:

1. Apparatus for integrating test program sets for digital circuit boards, the test program sets being output by an automatic test program generation system (ATG), comprising:
   an ATG host computer which includes means for generating test programs;
   a general purpose personal computer connected to the ATG host computer for receiving program sets output by the host computer, said general purpose computer including means for running and debugging said ATG test programs provided by the ATG host computer;
   a basic test unit connected to the general purpose personal computer for generating test patterns in response to running of said test programs by said general purpose computer and applying the test patterns to a digital circuit board under control of the personal computer; and
   an interface for transferring stimulus data and response data between the basic test unit and the digital circuit board,
   wherein said ATG host computer includes means for analyzing the performance of ATG test programs run by the general purpose computer which in turn comprises means for analyzing performance of the basic test unit and transmitting results back to the ATG host computer.

2. Apparatus as claimed in claim 1, wherein said general purpose computer is an IBM PC or compatible computer.

3. Apparatus as claimed in claim 1, further comprising a programmable power supply for providing the digital circuit boards with necessary supply voltages.

4. Apparatus as claimed in claim 1, wherein said computer, test unit, and interface constitute a stand-alone test station.

5. Apparatus as claimed in claim 1 wherein said personal computer further includes an interface card which provides counter-timer and pulse generator functions for generating control signals for the interface.

6. Apparatus as claimed in claim 5, wherein said interface card provides a digital multimeter in addition to counter-timer and pulse generator functions.

7. Apparatus as claimed in claim 1, wherein said test unit is an HP16500 logic analysis system.

8. Analysis as claimed in claim 5, further comprising stimulus and response channel expander boards for increasing the number of stimulus and response channels provided by the HP16500 Logic Analysis System.

9. A method of developing test programs sets, comprising the steps of
   a) analyzing a unit under test (UUT), generating a model thereof and programming said model into an automatic test generation system (ATG) host computer;
   b) using the host computer to generate stimulus test patterns and simulating the patterns in order to determine their effect on the model;
   c) upon achieving acceptable simulated results, integrating the test patterns into apparatus capable of applying the test patterns to the UUT, by sending the test pattern to a personal Computer and causing .the personal computer to integrate the test patterns into a basic test unit;

d) using the basic test unit to apply the test patterns thus generated to the UUT and analyzing the results;

e) if the results are acceptable, providing the UUT with sample faults and applying the test pattern;

f) if the results are not acceptable, varying the model or stimulus and repeating steps (c)–(e).

* * * * *